US012812784B2

(12) United States Patent
Zheng

(10) Patent No.: US 12,812,784 B2
(45) Date of Patent: Nov. 24, 2026

(54) CIRCUIT BOARD ASSEMBLY FOR VERTICAL POWER DELIVERY

(71) Applicant: Microsoft Technology Licensing, LLC, Redmond, WA (US)

(72) Inventor: Tieyu Zheng, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 114 days.

(21) Appl. No.: 18/917,325

(22) Filed: Oct. 16, 2024

(65) Prior Publication Data

US 2025/0374431 A1 Dec. 4, 2025

Related U.S. Application Data

(60) Provisional application No. 63/654,872, filed on May 31, 2024.

(51) Int. Cl.

| | |
|---|---|
| ***H05K 1/14*** | (2006.01) |
| ***H05K 1/02*** | (2006.01) |
| ***H05K 1/181*** | (2026.01) |
| ***H05K 3/36*** | (2006.01) |
| ***H05K 13/00*** | (2006.01) |

(52) U.S. Cl.

CPC ........... *H05K 1/142* (2013.01); *H05K 1/0222* (2013.01); *H05K 1/0266* (2013.01); *H05K 1/144* (2013.01); *H05K 1/181* (2013.01); *H05K 3/368* (2013.01); *H05K 13/0015* (2013.01); *H05K 2203/06* (2013.01)

(58) Field of Classification Search

CPC .... H05K 1/142; H05K 1/0222; H05K 1/0266; H05K 1/144; H05K 1/181; H05K 3/368

See application file for complete search history.

(56) References Cited

U.S. PATENT DOCUMENTS

2008/0242123 A1* 10/2008 Martinson .......... H01R 13/2442 439/70
2011/0042795 A1* 2/2011 Knickerbocker ............................ H10W 20/0245 257/E21.585
2021/0143141 A1* 5/2021 Bai ....................... H02M 3/003

* cited by examiner

*Primary Examiner* — Paresh Paghadal
(74) *Attorney, Agent, or Firm* — Alleman Hall LLP

(57) ABSTRACT

Examples are disclosed that relate to printed circuit board ("panel") arrangements for vertical power delivery from voltage regulators to an integrated electronic device mounted to the circuit board arrangement. One disclosed example assembly comprises a base power panel, a raised power panel mounted to the base power panel, a signal panel mounted to the base power panel such that a surface of the signal panel is generally flush with a surface of the raised power panel, and an integrated electronic device mounted to the raised power panel and the signal panel.

20 Claims, 5 Drawing Sheets

CIRCUIT BOARD ASSEMBLY FOR VERTICAL POWER DELIVERY

CROSS REFERENCE TO RELATED APPLICATIONS

This application claims priority to U.S. Provisional Patent Application Ser. No. 63/654,872, filed May 31, 2024, the entirety of which is hereby incorporated herein by reference for all purposes.

BACKGROUND

Printed circuit boards can be used to deliver power and provide signal pathways for the operation of an integrated circuit device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to printed circuit board ("panel") arrangements for vertical power delivery from voltage regulators to an integrated electronic device mounted to the circuit board arrangement. One disclosed example provides an assembly comprising a base power panel, a raised power panel mounted to the base power panel, a signal panel mounted to the base power panel such that a surface of the signal panel is generally flush with a surface of the raised power panel, and an integrated electronic device mounted to the raised power panel and the signal panel.

DETAILED DESCRIPTION

An integrated electronic device, such as a system-on-chip (SoC), can be connected to one printed circuit boards (PCBs) (also referred to as "panels" herein) to make electrical connections between the integrated electronic device and other electronic components. Sometimes an integrated electronic device is connected to multiple sub-panels, each with a different primary purpose. For example, an integrated electronic device can be connected to both a power panel and a signal panel which are usually stacked. The power panel is configured to supply power to the various components of the integrated electronic device. The signal panel is configured to transport data signals between the integrated electronic device and other devices.

Figure 1:
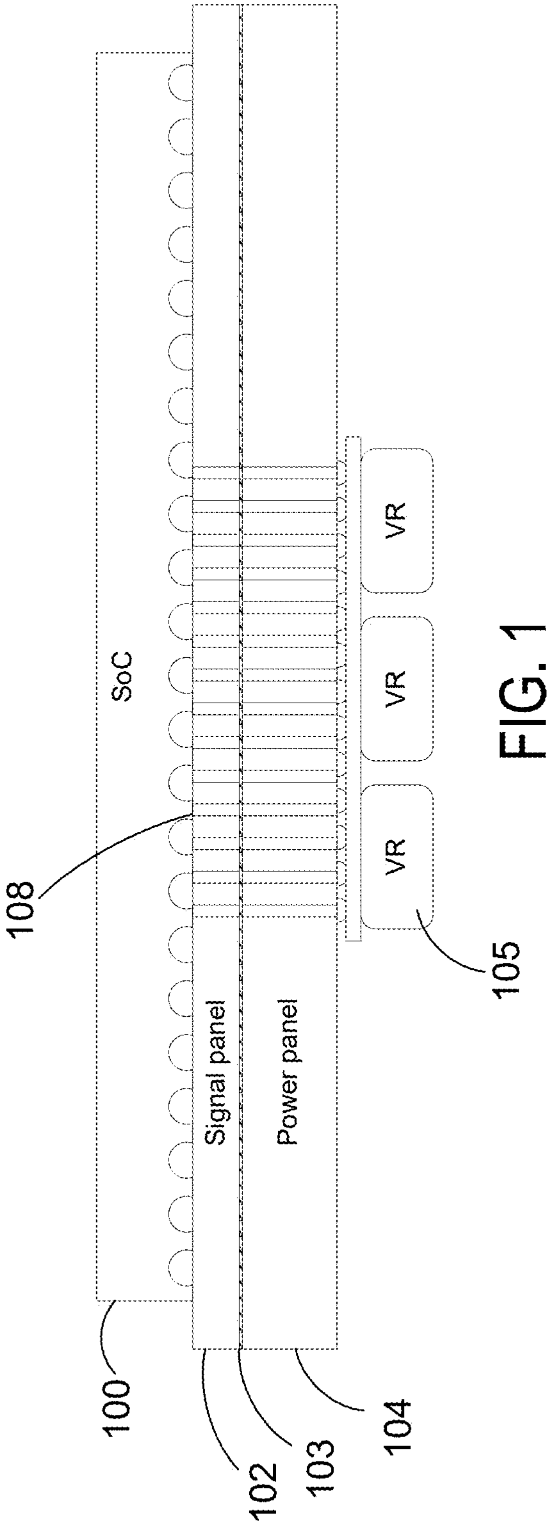
FIG. 1 shows a power panel and a signal panel in a stacked arrangement, where power is delivered to an integrated electronic device vertically through the power panel and the signal panel.

FIG. 1 schematically shows an example integrated electronic device ("SoC 100") electrically connected to a signal panel 102 and a power panel 104. The signal panel 102 and the power panel 104 are arranged in a stacked arrangement, with the signal panel 102 being arranged between the power panel 104 and the SoC 100. The power panel 104 includes voltage regulators 105 arranged on an opposite side of the power panel 104 as the signal panel 102.

The signal panel 102 includes a central region in which power panel 104 connections (for example, power panel connection 108) extend through the signal panel 102 to the SoC 100. The power connections (e.g. power panel connection vias 108) also extend through the power panel 104. The arrangement of power connections extending through the power panel 104 and the signal panel 102 in a direction generally normal to the plane of the power panel 104 and a plane of the signal panel 102 can be referred to as vertical power delivery. A layer of adhesive 103 bonds the signal panel 102 to the power panel 104. The layer of adhesive 103 can be an anisotropic conductive film or prepreg laminate with connection vias (108), for example, to form electrical connections between the power panel 104 and the signal panel 102.

The length of the power connections through both the power panel and the signal panel contributes to inductive losses for power provided by the voltage regulators 105 to the SoC 100. Thus, it can be advantageous to reduce this length.

In FIG. 1, the central region of the SoC 100 does not include major signal connections to the signal panel 102. Instead, the major signal connections of the SoC 100 are at an outer region of the signal panel 102. Likewise, an outer region of the SoC 100 does not include major power connections. Instead, major power connections are located in the central region of the SoC 100. The term "major power connections" distinguishes power transmissions in power panels from power transmissions in signal panels. Likewise, the term "major signal connections" distinguishes signal transmission in signal panels from signal transmission in power panels.

Thus, a signal panel and a power panel can be modified compared to the arrangement shown in FIG. 1 to provide a shorter distance for power connections between voltage regulators and a SoC ("vertical power delivery paths"). More particularly, a thickness of a power panel can be reduced, and a second power panel ("raised power panel") can be mounted on the reduced thickness power panel ("base power panel") in regions in which power connections are made to the SoC. Further, a signal panel can be designed in which the central region is removed. The signal panel with the removed central region then can be seated on the base power panel in such a manner that a surface of the signal panel that interfaces with the SoC is generally flush with the surface of the raised power panel that interfaces with the SoC. In this arrangement, both the signal panel and the raised power panel are supported on the base power panel.

Then, the SoC can be mounted on the signal panel and the raised power panel to connect the SoC to both panels. The term "generally flush" indicates that an integrated circuit package (e.g. a SoC) can be mounted to both surfaces (the raised power panel surface and the signal panel surface), such as in a surface mount arrangement or other arrangement. In other examples, a SoC or other integrated device can have other suitable arrangements of signal panel connections and power panel connections than the respective outer and central signal and power connections described herein, and a raised power panel and a signal panel can be appropriately configured.

Figure 2:
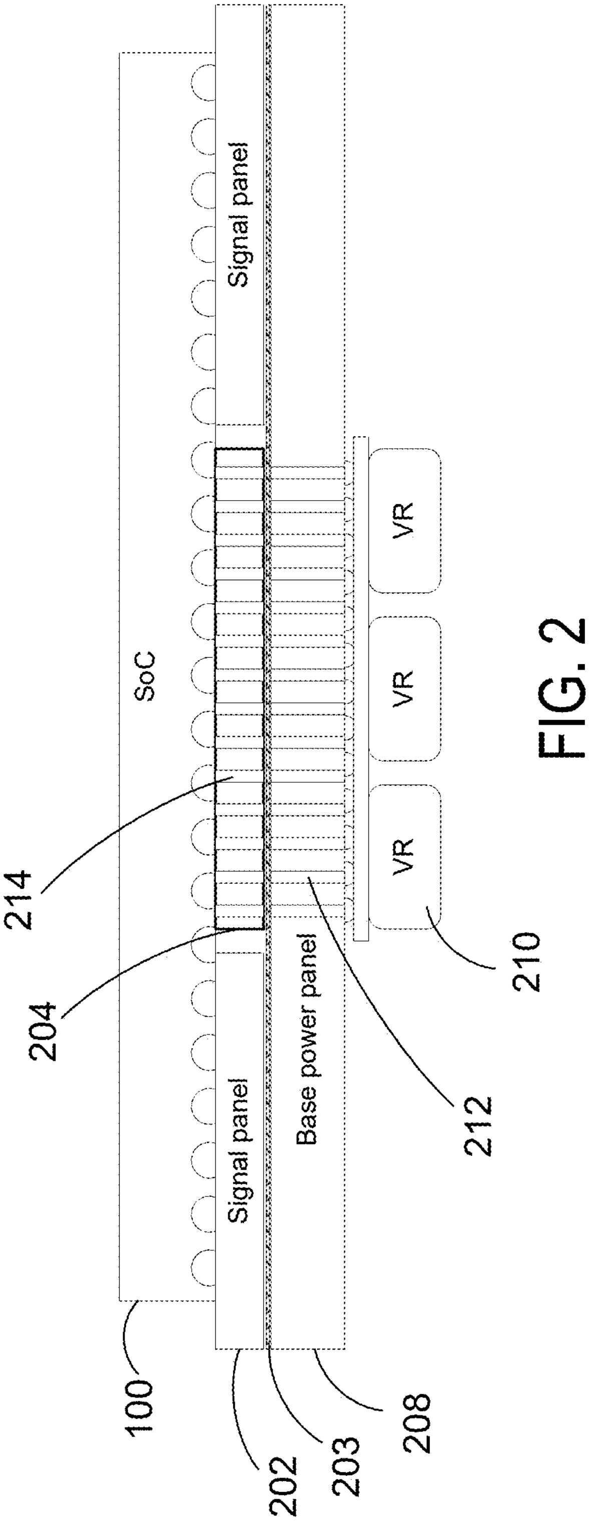
FIG. 2 shows a raised power panel and a signal panel arranged in a nested arrangement on a base power panel, where power is delivered to an integrated electronic device vertically through the base power panel and the raised power panel.

FIG. 2 shows an example arrangement of power and signal panels to shorten a length of power connections between voltage regulators and an SoC compared to the arrangement of FIG. 1. More particularly, FIG. 2 shows SoC 100 mounted on a signal panel 202 and a raised power panel 204. The signal panel 202 has a cutout central section. The raised power panel 204 is located within the cutout central section of the signal panel 202. Both the signal panel 202 and the raised power panel 204 are bonded to and supported by a base power panel 208. The base power panel 208 is a reduced thickness power panel to which voltage regulators 210 are mounted. Vertical power delivery vias 212 extend through the base power panel 208 to meet with corresponding vertical power delivery vias 214 through the raised power panel 204. A layer of adhesive 203 bonds the base power panel 208 and the raised power panel 204. As mentioned above, the layer of adhesive 203 can be an anisotropic conductive material to form electrical connections between the base power panel 208 and the raised power panel 204. In other examples, other suitable methods can be used to bond and electrically connect the base power panel 208 and the raised power panel 204, such as prepreg laminate. The vertical power delivery vias 214 through the raised power panel 204 interface with the SoC 100 to provide power to the SoC 100. Similarly, the signal panel 202 interfaces electrically with the SoC 100 where the SoC 100 is mounted to the signal panel 202.

The vertical power delivery paths that extend from the voltage regulators 210 to the SoC 100 in FIG. 2 are shorter than the vertical power delivery paths that extend from the voltage regulators 105 to the SoC 100 in FIG. 1. The thickness of the raised power panel 204 plus the base power panel 208 of FIG. 2 is approximately the same as the thickness of the power panel 104 of FIG. 1. Further, the thickness of the raised power panel 204 of FIG. 2 is approximately the same as the thickness of the signal panel 202 of FIG. 2. Thus, where the thickness of the signal panel 102 of FIG. 1 and the signal panel 202 of FIG. 2 are the same, the length of the vertical power delivery paths of FIG. 2 are shorter than the vertical power delivery paths of FIG. 1 by a thickness of the signal panel 102. This can help reduce the inductive losses of the vertical power delivery paths of FIG. 2 compared to the vertical power delivery paths of FIG. 1.

Figure 3A:
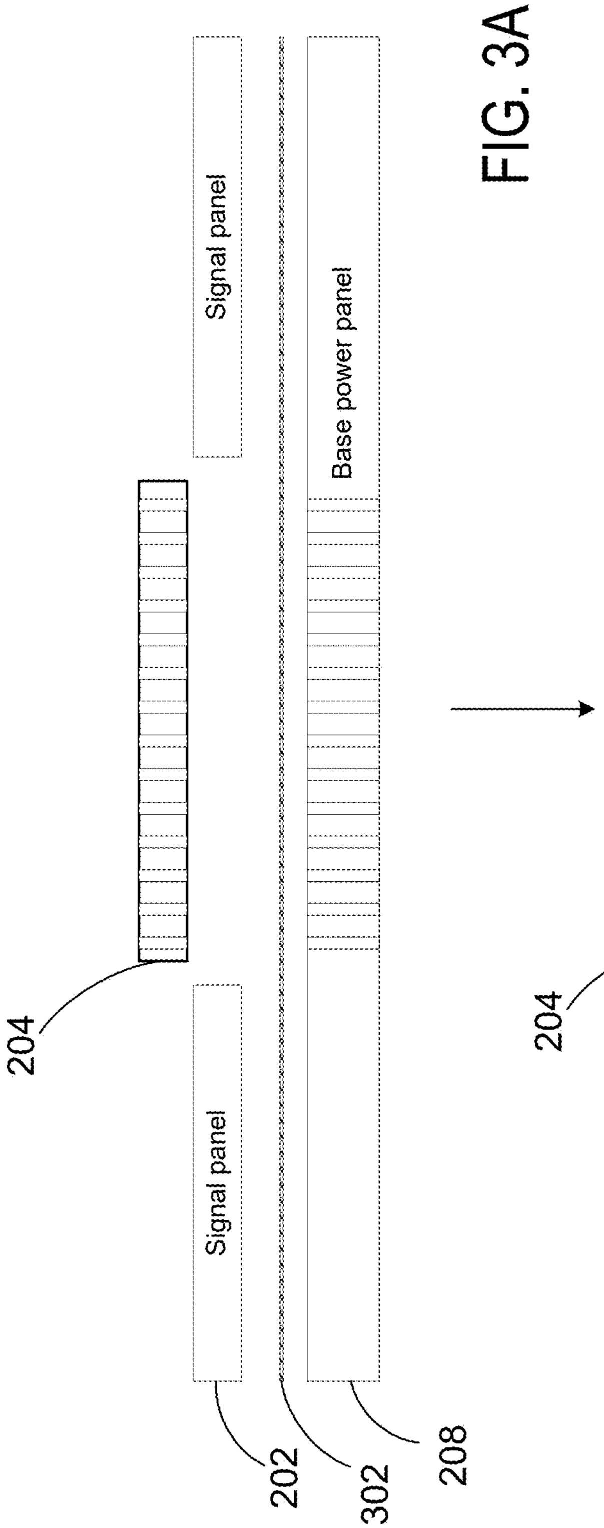
FIGS. 3A-3B schematically illustrate a sequential lamination of a signal panel and a raised power panel to a base power panel.
Figure 3B:
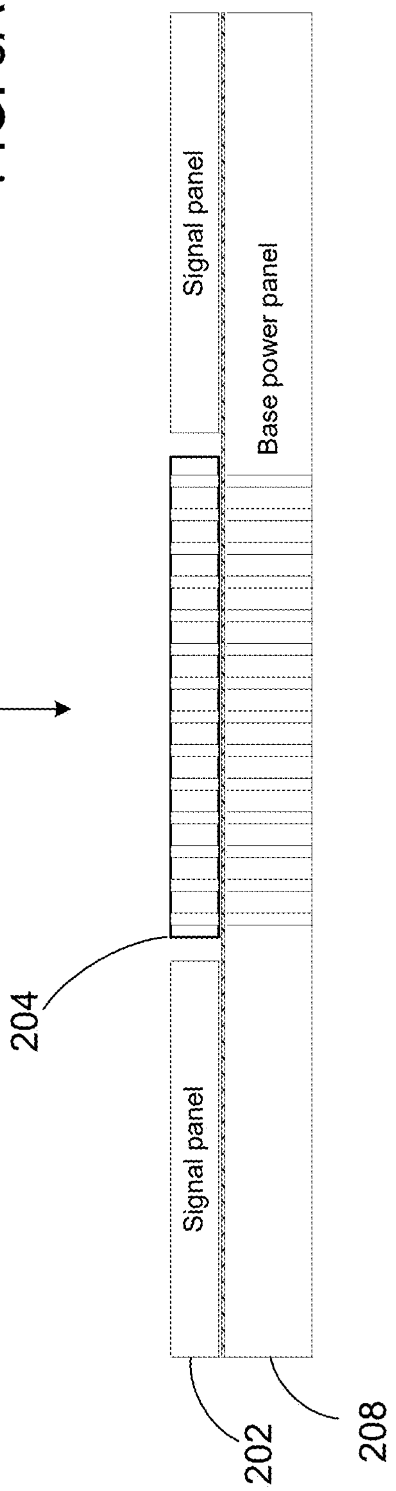

FIGS. 3A-3B schematically illustrates an example method of constructing the circuit board and SoC arrangement depicted in FIG. 2. First, one of the signal panel 202 or the raised power panel 204 can be laminated to the base power panel 208 using, for example, a layer of adhesive 302 (e.g. prepreg anisotropically conductive adhesive or plated through holes (PTH) drilled through all panels) configured to form vertical electrical connections between contacts on the panels 202, 204 and contacts on the SoC. Next, the other of the signal panel 202 or the raised power panel 204 can be laminated to the base power panel 208. In this manner, the signal panel 202 and the raised power panel 204 are sequentially laminated to the base power panel 208. After both the signal panel 202 and the raised power panel 204 are laminated to the base power panel 208, then the laminated structure can be cured. In other examples, the signal panel 202 and the raised power panel 204 can be laminated together in a single step. In some examples, the signal panel 202 and the raised power panel 204 can have different layer stack, different dielectric materials, and different copper layer thickness by design optimization.

Figure 4:
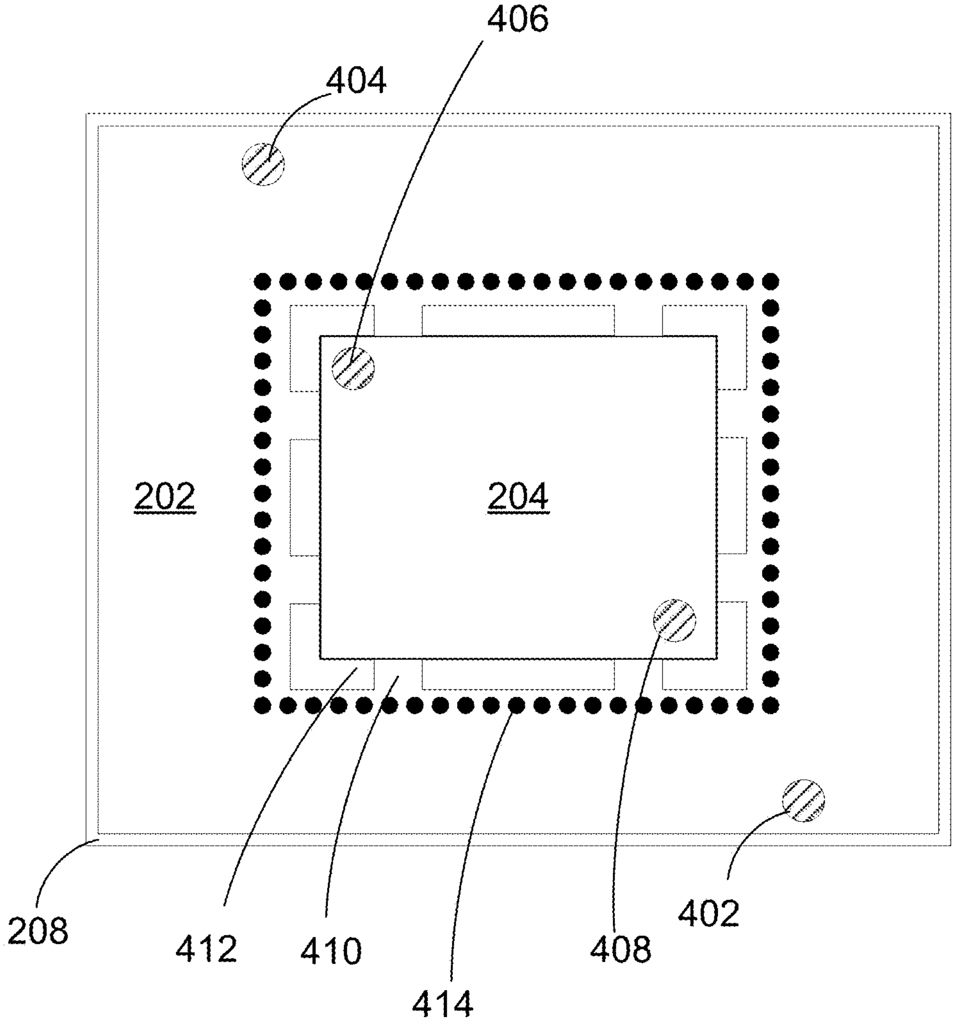
FIG. 4 schematically illustrates a top view of a signal panel and a raised power panel and shows alignment features used to align the signal panel and the raised power panel with an underlying base power panel.

FIG. 4 shows a schematic top view of the signal panel 202 and the raised power panel 204 of FIG. 2. More particularly, FIG. 4 illustrates example alignment features that can be used to help correctly align the signal panel 202 and the raised power panel 204 with the underlying base power panel 208. First, the base power panel 208 includes example alignment posts 402, 404 configured to align the signal panel 202 with the base power panel 208. The alignment posts 402, 404 can extend from the base power panel 208 through holes in the signal panel 202 to align the signal panel 202 with the base power panel 208. Similarly, the base power panel 208 includes alignment posts 406, 408 configured to align the raised power panel 204 with the base power panel 208. Alternatively or additionally, the signal panel 202 and/or the raised power panel 204 can include posts or other features that extend into corresponding holes, or otherwise interface with other complementary features on the base power panel.

FIG. 4 also shows alignment features in the form of example key features 410 formed on an inner edge of the signal panel 202. The key features 410 interface with complementary features formed in an alignment bracket 412 that can be mounted on the base power panel. The alignment bracket 412 further includes an inner perimeter that is complementary in shape to the outer edge of the raised power panel. In other examples, the outer edge of the raised power panel 204 can include key features that interface with complementary features in the alignment bracket 412. In yet other examples, an outer edge of the raised power panel 204 and the inner edge of the signal panel 202 can include complementary key features that fit one another directly, without an intervening alignment bracket. It will be understood that alignment features of any form, such as a protrusion and a complementary receptacle not only can help align the signal panel 202 and the raised power panel 204 on base power panel 208, but also can help maintain the alignment when under mechanical pressure during lamination.

Signal panel 202 further can include shielding structures 414 configured to shield signal lines of signal panel 202 from electromagnetic interference arising from power transmission through raised power panel 204. The shielding structures 414 are schematically shown as electrically conductive vias that extend through signal panel 202, but can have any suitable configuration.

Figure 5:
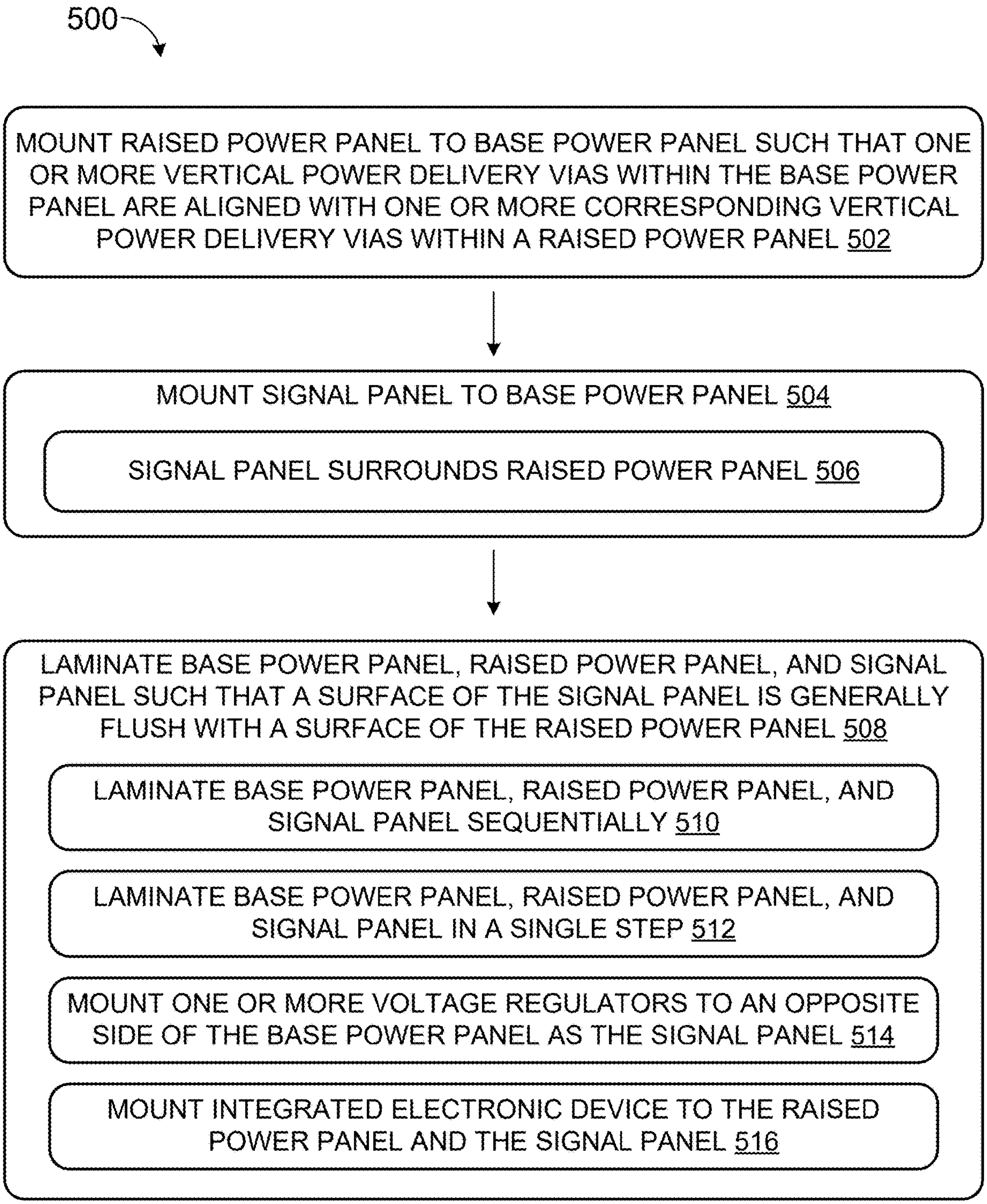
FIG. 5 shows an example method of forming an assembly comprising a base power panel, a raised power panel, and a signal panel.

In the depicted embodiment, the raised power panel 204 and signal panel 202 have complementary rectangular shapes, such that the raised power panel 204 nests within the signal panel 202. In other examples, a power panel and a signal panel can have any other suitable shape that allows the power panel and the signal panel to be mounted to a base power panel in a manner that provides a generally planar surface for mounting an integrated electronic device. In some such examples, the power panel and the signal panel can be in side-by-side relationships, rather than nested relationships. Further, in some examples, a signal panel can be nested within a power panel. FIG. 5 depicts a flow diagram for an example method 500 of forming an assembly comprising a base power panel, a raised power panel, and a signal panel. The assembly can be used to provide power and signals to an integrated electronic device, such as a SoC, processor, memory, application-specific integrated circuit (ASIC), or other integrated electronic device.

The method 500 comprises, at 502, mounting the raised power panel to the base power panel such that one or more vertical power delivery vias within the base power panel are aligned with one or more corresponding vertical power delivery vias within the raised power panel. Method 500 further comprises, at 504, mounting the signal panel to the base power panel. The mounting of the raised power panel at 502 and the mounting of the signal panel at 504 can be performed in any suitable order, including simultaneously.

In some examples, at 506, the signal panel may be configured to surround the raised power panel. In other examples, the signal panel may have a side-by-side arrangement with the power panel. In further examples, the power panel may be configured to surround the signal panel, depending on a configuration of signal and power contacts on an integrated electronic device to be mounted to the assembly. The method further comprises, at 508, laminating the base power panel, the raised power panel, and the signal panel such that a surface of the signal panel is generally flush with a surface of the raised power panel. As mentioned above, the term "generally flush" indicates that an integrated electronic device can be mounted to both the signal panel and the raised power panel. In some examples, laminating at may comprise, at 510, sequentially laminating the base power panel, the raised power panel, and the signal panel. In other examples, laminating at 508 may comprise performing the lamination in a same step 512.

After forming the panel assembly, method 500 further comprises mounting electronic components to the panel assembly. For example, at 514, method 500 comprises mounting one or more voltage regulators to an opposite side of the base power panel as the signal panel. Further, method 500 comprises, at 516, mounting an integrated electronic device to the raised power panel and the signal panel to electrically connect the one or more voltage regulators and the signal panel to the integrated electronic device. Other components also may be mounted to the assembly. It will be understood that the steps of method 500 may be performed in any suitable sequence.

A circuit board assembly according to the disclosed examples can increase an efficiency of power delivery to an integrated device compared to the use of other circuit board arrangements, such as where power is delivered from voltage regulators through both a power panel and a signal panel to a SoC. The disclosed examples can be used to deliver power vertically to any suitable integrated device, such as an SoC configured to provide computing and storage capabilities to a computing system of one or more computing devices with high power demands, such as an AI (artificial intelligence) server or workstation. Further, a circuit board assembly according to the present disclosure can be used in any other suitable type of computing system.

Figure 6:
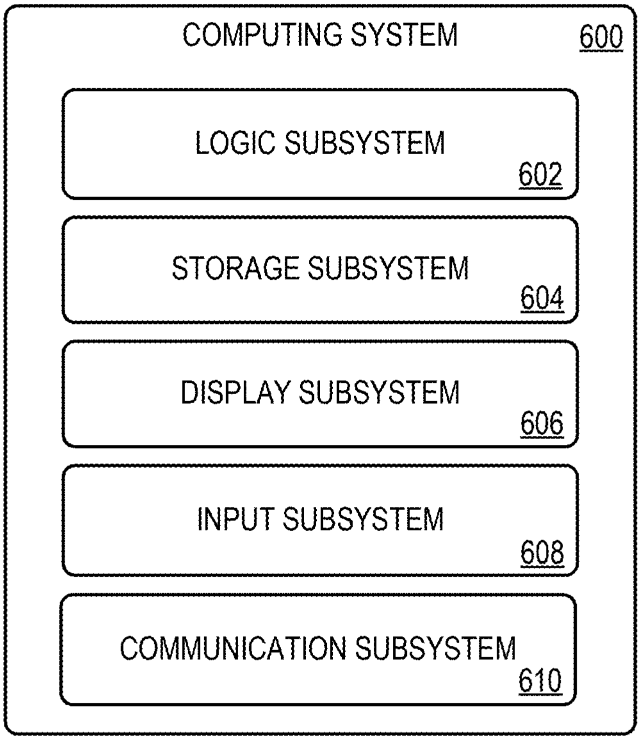
FIG. 6 schematically illustrates a block diagram of an example computing system.

FIG. 6 schematically shows a non-limiting example of a computing system 600 that can implement one or more of the structures and/or methods described above. Computing system 600 is shown in simplified form. Computing system 600 may take the form of one or more personal computers, server computers, tablet computers, home-entertainment computers, network computing devices, gaming devices, mobile computing devices, mobile communication devices (e.g., smart phone), and/or other computing devices.

Computing system 600 includes a logic subsystem 602 and a storage subsystem 604. Computing system 600 may optionally include a display subsystem 606, input subsystem 608, communication subsystem 610, and/or other components not shown in FIG. 6.

Logic subsystem 602 includes one or more physical devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem may include one or more processors configured to execute software instructions. Additionally or alternatively, the logic subsystem may include one or more hardware or firmware logic machines configured to execute hardware or firmware instructions. Processors of the logic subsystem may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic subsystem may be virtualized and executed by remotely accessible, networked computing devices configured in a cloud-computing configuration.

Storage subsystem 604 includes one or more physical devices configured to hold instructions executable by the logic subsystem to implement the methods and processes described herein. When such methods and processes are implemented, the state of storage subsystem 604 may be transformed—e.g., to hold different data.

Storage subsystem 604 may include removable and/or built-in devices. Storage subsystem 604 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 604 may include volatile, nonvolatile, dynamic, static, read/write, read-only, random-access, sequential-access, location-addressable, file-addressable, and/or content-addressable devices.

It will be appreciated that storage subsystem 604 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 602 and storage subsystem 604 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 606 may be used to present a visual representation of data held by storage subsystem 604. This visual representation may take the form of a graphical user interface (GUI). As the herein described methods and processes change the data held by the storage machine, and thus transform the state of the storage machine, the state of display subsystem 606 may likewise be transformed to visually represent changes in the underlying data. Display subsystem 606 may include one or more display devices utilizing virtually any type of technology. Such display devices may be combined with logic subsystem 602 and/or storage subsystem 604 in a shared enclosure, or such display devices may be peripheral display devices.

When included, input subsystem 608 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 610 may be configured to communicatively couple computing system 600 with one or more other computing devices. Communication subsystem 610 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 600 to send and/or receive messages to and/or from other devices via a network such as the Internet.

In another example, an assembly for a computing device comprises a base power panel, a raised power panel mounted to the base power panel, a signal panel mounted to the base power panel such that a surface of the signal panel is generally flush with a surface of the raised power panel, and an integrated electronic device mounted to the raised power panel and the signal panel. In such an example, or any other example, the assembly additionally or alternatively comprises one or more voltage regulators mounted to an opposite side of the base power panel as the raised power panel, and one or more corresponding vertical power delivery via(s) extending from the one or more voltage regulators through the base power panel and the raised power panel to the integrated electronic device. In any of the preceding examples, or any other example, the assembly additionally or alternatively comprises one or more alignment features configured to align the base power panel, the raised power panel, and the signal panel. In any of the preceding examples, or any other example, the one or more alignment features additionally or alternatively comprise one of a protrusion or the complementary receptacle located on the raised power panel or the signal panel. In any of the preceding examples, or any other example, the one or more alignment features additionally or alternatively comprise one of a protrusion or a complementary receptacle located on an outer edge of the raised power panel, and another of the protrusion or the complementary receptacle located on an inner edge of the signal panel. In any of the preceding examples, or any other examples, the one or more alignment features additionally or alternatively comprises an alignment bracket mounted on the base power panel. In any of the preceding examples, or any other example, the signal panel additionally or alternatively comprises one or more shielding structures configured to shield electrical pathways of the signal panel from electromagnetic interference from the raised power panel. In any of the preceding examples, or any other examples, the one or more shielding structures additionally or alternatively comprise one or more shielding vias.

In another example, a computing device comprises an assembly, the assembly comprising a base power panel, a raised power panel mounted to the base power panel, a signal panel mounted to the base power panel, such that a surface of the signal panel is generally flush with a surface of the raised power panel, and an integrated electronic device mounted to the raised power panel and the signal panel. In such an example, or any other example, the assembly additionally or alternatively comprises one or more voltage regulators mounted to an opposite side of the base power panel as the signal panel, and one or more corresponding vertical power delivery via(s) extending from the one or more voltage regulators through the base power panel and the raised power panel to the integrated electronic device. In any of the preceding examples, or any other example, the computing device additionally or alternatively comprises a server. In any of the preceding examples, or any other examples, the server is an artificial intelligence (AI) server. In any of the preceding examples, or any other example, the assembly additionally or alternatively comprises one or more alignment features configured to align the base power panel, the raised power panel, and the signal panel. In any of the preceding examples, or any other example, the one or more alignment features additionally or alternatively comprises an alignment bracket mounted on the base power panel. In any of the preceding examples, or any other example, the signal panel additionally or alternatively comprises one or more shielding structures configured to shield electrical pathways of the signal panel from electromagnetic interference from the raised power panel.

In yet another example, a method of constructing an assembly comprising a base power panel, a raised power panel, a signal panel for providing power and signals to an integrated electronic device comprises: mounting the raised power panel to the base power panel such that one or more vertical power delivery vias within the base power panel are aligned with one or more corresponding vertical power delivery vias within the raised power panel; mounting the signal panel to the base power panel; and laminating the base power panel, the raised power panel, and the signal panel such that a surface of the signal panel is generally flush with a surface of the raised power panel. In such an example, or any other example, laminating the base power panel, the raised power panel, and the signal panel occurs sequentially. In any of the preceding examples, or any other example, laminating the base power panel, the raised power panel, and the signal panel occurs in a single step. In any of the preceding examples, or any other example, the signal panel surrounds the raised power panel. In any of the preceding examples, or any other example, the method additionally or alternatively comprises mounting one or more voltage regulators to an opposite side of the base power panel as the signal panel and mounting the integrated electronic device to the raised power panel and the signal panel.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An assembly for a computing device, the assembly comprising:

a base power panel;

a raised power panel mounted to the base power panel;

a signal panel mounted to the base power panel, such that a surface of the signal panel is generally flush with a surface of the raised power panel; and an integrated electronic device mounted to the raised power panel and the signal panel.

2. The assembly of claim 1, further comprising one or more voltage regulators mounted to an opposite side of the base power panel as the raised power panel, and one or more corresponding vertical power delivery vias extending from the one or more voltage regulators through the base power panel and the raised power panel to the integrated electronic device.

3. The assembly of claim 1, further comprising one or more alignment features configured to align the base power panel, the raised power panel, and the signal panel.

4. The assembly of claim 3, wherein the one or more alignment features comprise one of a protrusion or a complementary receptacle located on the base power panel, and another of the protrusion or the complementary receptacle located on the raised power panel or the signal panel.

5. The assembly of claim 3, wherein the one or more alignment features comprise one of a protrusion or a complementary receptacle located on an outer edge of the raised power panel, and another of the protrusion or the complementary receptacle located on an inner edge of the signal panel.

6. The assembly of claim 3, wherein the one or more alignment features comprise an alignment bracket mounted on the base power panel.

7. The assembly of claim 1, wherein the signal panel comprises one or more shielding structures configured to shield electrical pathways of the signal panel from electromagnetic interference from the raised power panel.

8. The assembly of claim 7, wherein the one or more shielding structures comprise one or more shielding vias.

9. A computing device, comprising:

an assembly, comprising a base power panel;

a raised power panel mounted to the base power panel;

a signal panel mounted to the base power panel, such that a surface of the signal panel is generally flush with a surface of the raised power panel; and an integrated electronic device mounted to the raised power panel and the signal panel.

10. The computing device of claim 9, wherein the assembly further comprises one or more voltage regulators mounted to an opposite side of the base power panel as the signal panel, and one or more corresponding vertical power delivery vias extending from the one or more voltage regulators through the base power panel and the raised power panel to the integrated electronic device.

11. The computing device of claim 10, wherein the computing device comprises a server.

12. The computing device of claim 11, wherein the server is an artificial intelligence (AI) server.

13. The computing device of claim 9, wherein the assembly further comprises one or more alignment features configured to align the base power panel, the raised power panel, and the signal panel.

14. The computing device of claim 13, wherein the one or more alignment features comprise an alignment bracket mounted on the base power panel.

15. The computing device of claim 9, wherein the signal panel comprises one or more shielding structures configured to shield electrical pathways of the signal panel from electromagnetic interference from the raised power panel.

16. A method of constructing an assembly comprising a base power panel, a raised power panel, and a signal panel for providing power and signals to an integrated electronic device, the method comprising:

mounting the raised power panel to the base power panel such that one or more vertical power delivery vias within the base power panel are aligned with one or more corresponding vertical power delivery vias within the raised power panel;

mounting the signal panel to the base power panel; and laminating the base power panel, the raised power panel, and the signal panel such that a surface of the signal panel is generally flush with a surface of the raised power panel.

17. The method of claim 16, wherein laminating the base power panel, the raised power panel, and the signal panel occurs sequentially.

18. The method of claim 16, wherein laminating the base power panel, the raised power panel, and the signal panel occurs in a single step.

19. The method of claim 16, wherein the signal panel surrounds the raised power panel.

20. The method of claim 16, further comprising mounting one or more voltage regulators to an opposite side of the base power panel as the signal panel and mounting the integrated electronic device to the raised power panel and the signal panel.

* * * * *